(12) United States Patent
Wagner

(10) Patent No.: US 9,188,620 B1
(45) Date of Patent: Nov. 17, 2015

(54) METHOD OF DETECTION AND ISOLATION OF FAULTS WITHIN POWER CONVERSION AND DISTRIBUTION SYSTEMS

(71) Applicant: Hamilton Sundstrand Corporation, Charlotte, NC (US)

(72) Inventor: Carl A. Wagner, Beloit, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 1 day.

(21) Appl. No.: 14/293,756

(22) Filed: Jun. 2, 2014

(51) Int. Cl.
*H02H 7/06* (2006.01)
*G01R 31/02* (2006.01)
*G01R 31/08* (2006.01)

(52) U.S. Cl.
CPC .............. *G01R 31/02* (2013.01); *G01R 31/086* (2013.01); *G01R 31/088* (2013.01)

(58) Field of Classification Search
CPC ......................................................... H02H 7/06
USPC ...................................... 318/34, 558; 361/20
See application file for complete search history.

(56) References Cited

U.S. PATENT DOCUMENTS

| 5,488,532 | A | 1/1996 | Mrowiec et al. |
| 5,523,938 | A | 6/1996 | Wagner et al. |
| 5,805,394 | A * | 9/1998 | Glennon .......................... 361/20 |
| 7,796,366 | B2 | 9/2010 | Kilroy et al. |
| 2002/0085326 | A1 | 7/2002 | Kim et al. |
| 2006/0109009 | A1 | 5/2006 | Banke et al. |
| 2010/0148791 | A1 | 6/2010 | Oldenburg et al. |
| 2012/0112760 | A1 | 5/2012 | Yoscovich et al. |
| 2013/0138366 | A1 | 5/2013 | Yan et al. |

OTHER PUBLICATIONS

The European Search Report mailed Sep. 8, 2015 for European Application No. 15169350.4.

* cited by examiner

*Primary Examiner* — David S Luo
(74) *Attorney, Agent, or Firm* — Kinney & Lange, P.A.

(57) ABSTRACT

A power conversion and distribution system detects faults by monitoring differential current and differential power at certain locations in the system. Current loss faults are detected based on the monitored differential current, and series arc faults are detected based on the monitored differential power. A system controller may make the fault determinations and disable a power converter circuit of the power conversion and distribution system in response to detection of a fault.

15 Claims, 3 Drawing Sheets

METHOD OF DETECTION AND ISOLATION OF FAULTS WITHIN POWER CONVERSION AND DISTRIBUTION SYSTEMS

BACKGROUND

The present disclosure relates to detection and isolation of faults in power conversion and distribution systems.

In electrical power conversion and distribution systems, the measurement of currents and power levels of the electrical wiring is often desirable for protection of the system and connected equipment, and to ensure safety in the event of a failure. In many aircraft systems, for example, the quality of the electrical power is critical for flight controls and for electrically driven hydraulic pumps. Internal faults can cause loss of power, or unacceptable degraded power quality to these flight critical systems. Effective protection functions within the power conversion and distribution systems improve flight safety by the prevention or minimization of the effect of electrical faults. Rapid detection and isolation/segregation of short circuit faults are desirable due to the localized heating and potential damage that high current or arcs can cause.

SUMMARY

A power conversion and distribution system includes a generator circuit including an electrical power generator configured to generate a power output signal, a power converter circuit connected to receive the input signal from the electrical power generator and to provide a converted power output signal, and a distribution circuit connected to receive the converted power output signal and distribute the converted power output signal to at least one module that includes a load. A system controller is coupled to the generator circuit, the power converter circuit and the distribution circuit, and is configured to monitor differential current between at least one first node pair selected from the group consisting of an output of the generator circuit and an input of the power converter circuit, an output of the power converter circuit and an input of the at least one module of the distribution circuit, and to monitor differential power between at least one second node pair selected from the group consisting of the output of the generator circuit and the input of the power converter circuit, the output of the generator circuit and the output of the power converter circuit, and the input of the power converter circuit and the output of the power converter circuit. A current loss fault is detected based on the monitored differential current, and a series arc fault is detected based on the monitored differential power.

DETAILED DESCRIPTION

A fault protection scheme for a power conversion and distribution system employs a differential current algorithm and a differential power algorithm, so as to provide the ability to detect current loss faults and series arc faults in the wiring between components and/or across certain components or groups of components. The protection may be implemented in both a system controller/processor and in an independent hardware communication path, to provide a high level of safety in the operation of the system.

Figure 1:
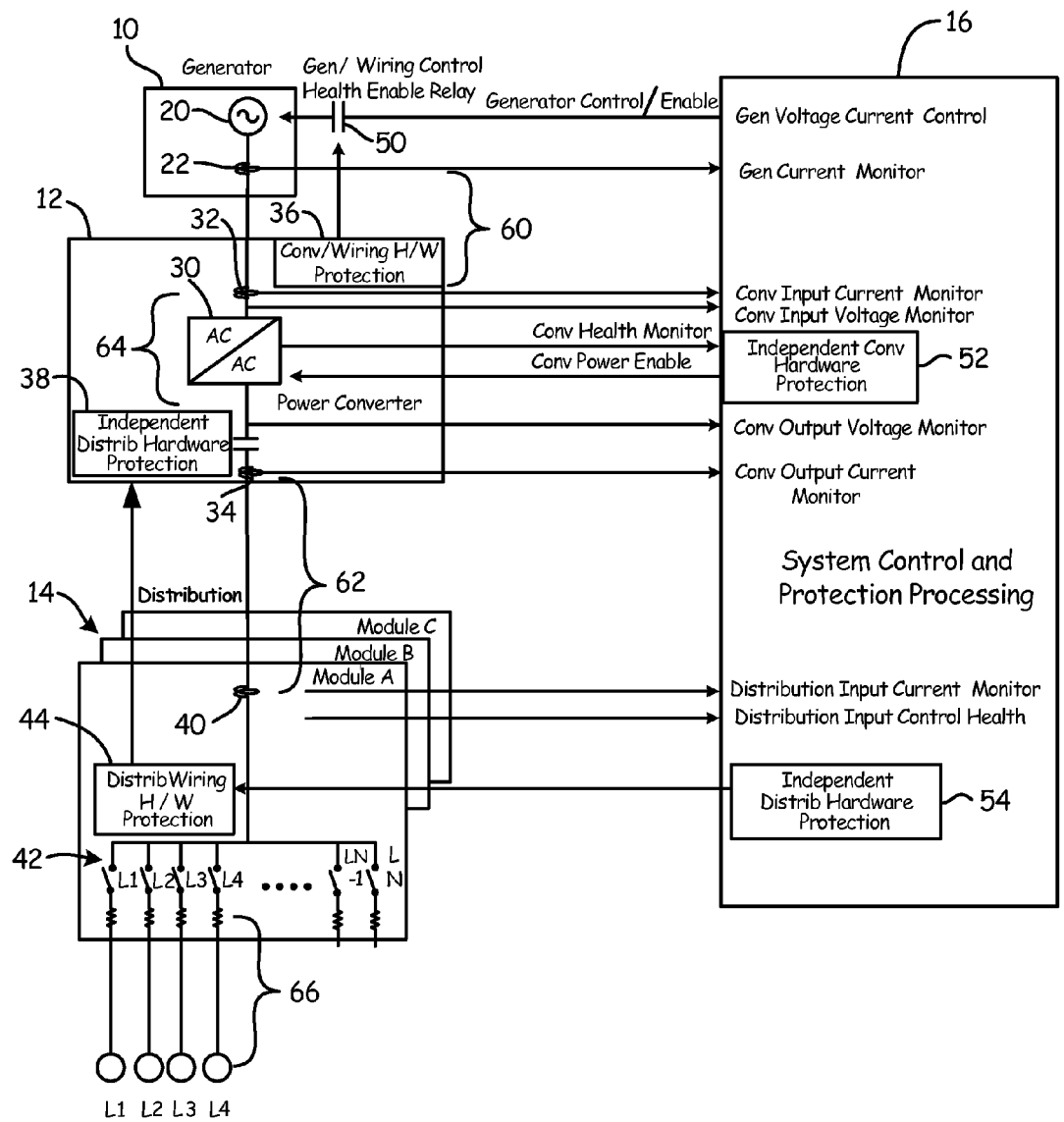
FIG. 1 is a simplified schematic block diagram of a single line of a power conversion and distribution system utilizing a fault protection configuration according to an embodiment of the present invention.

FIG. 1 is a simplified schematic block diagram of a single line of an AC power conversion and distribution system utilizing a fault protection configuration according to an embodiment of the present invention. The power conversion and distribution system includes an AC generator circuit 10, power converter circuit 12, distribution circuit 14, and system controller/processor 16. Generator circuit 10 includes AC generator 20 and current sensor 22. Power converter circuit 12 includes AC/AC converter 30, current sensors 32 and 34, converter hardware protection circuit 36, and distribution hardware protection circuit 38. Distribution circuit 14 includes a number of modules (shown by example in FIG. 1 as Module A, Module B and Module C, although any number of modules may be present), each of which includes current sensor 40, load array 42, and distribution hardware protection circuit 44.

System controller/processor 16 is coupled to control and monitor generator circuit 10. Specifically, system controller/processor 16 is coupled to AC generator 20 via generator control health enable relay 50, to provide a control signal for operating AC generator 20. System controller/processor 16 is also coupled to current sensor 22 to monitor the current at the output of generator circuit 10.

System controller/processor 16 is also coupled to control and monitor power converter circuit 12. Specifically, system controller/processor 16 is coupled to current sensor 32 and to an input terminal of AC/AC converter 30 to monitor the current and voltage at the input of power converter circuit 12. System controller/processor 16 is also coupled to current sensor 34 and to an output terminal of AC/AC converter 30 to monitor the current and voltage at the output of power converter circuit 12. System controller/processor 16 further includes independent converter hardware protection module 52, which is coupled to monitor the health of AC/AC power converter 30 and to provide a power enable signal to AC/AC converter 30.

System controller/processor is additionally coupled to control and monitor distribution circuit 14. Specifically, system controller/processor 16 is coupled to current sensor 40 to monitor the current at the input of distribution circuit 14, and is coupled to the current path of distribution circuit 14 to monitor the health of distribution circuit 14. System controller/processor further includes independent distribution hardware protection module 54, which is coupled to provide signals to distribution hardware protection circuit 44 in distribution circuit 14, to establish a redundant path for communication of monitoring and protection data.

The configuration and connections provided in the example circuitry shown in FIG. 1 provide power, control and communication architectures for the power conversion and distribution system shown, so as to enhance safety of the system and provide full zonal protection at a number of locations in the system. Measurement and detection of any possible fault currents are provided via the integrated current sensors (e.g., current sensors 22, 32, 34 and 40), so that all wiring and equipment locations are protected. Current detection and protection algorithms may be used in these architectures to identify and isolate failures so that minimal equipment is affected.

In exemplary operation, a differential current algorithm may be used to detect wiring faults based on current loss between components, and a differential power algorithm may be used to detect wiring faults based on a loss of power between components that exceeds a threshold. These algorithms are explained in detail below.

Differential Current Algorithm

A wiring fault may be detected if the difference between a current leaving a source component and a current arriving at a load component is greater than expected in normal operation of the system. This condition ("lost" current exceeding an expected current loss amount by a threshold) indicates that an unacceptable amount of the source current is being shunted to ground or to other conductors. The locations of these faults can be indicated by applying low level differential current measurements at opposite ends of power wires or bus bars, and opening the switch powering the wires/bus bars if the difference between the current measurements is too large.

An equation representing an exemplary criteria for detecting a fault according to this differential current algorithm is shown below:

$$\text{Fault:Source Current-Received Current} > [1+k]*\text{Normal Current Loss}$$

In this equation, k is a constant selected to identify fault conditions without generating a high number of false fault indications, since the difference in currents may fluctuate by small amounts due to non-fault conditions. In an exemplary embodiment, k is selected to be 0.08 in order to achieve that objective. In order to detect a fault, the equation must be satisfied for an amount of time that exceeds a threshold, so that spurious signal variations do not result in false positive detections of faults.

Referring again to FIG. 1, the differential current algorithm may be performed at multiple locations (node pairs) in the system. For example, the current monitored at current sensor 22 in generator circuit 10 may be the source current, and the current monitored at current sensor 32 in power converter circuit 12 may be the received current—that is, the current loss between generator circuit 10 and power converter circuit 12 may be monitored. Monitoring the differential current between current sensor 22 and current sensor 32 creates a zone of protection from wiring faults between generator circuit 10 and power converter circuit 12, illustrated as zone 60.

Similarly, the current monitored at current sensor 34 in power converter circuit 12 may be the source current, and the current monitored at current sensor 40 in distribution circuit 14 may be the received current—that is, the current loss between power converter circuit 12 and distribution circuit 14 may be monitored. Monitoring the differential current between current sensor 34 and current sensor 40 creates a zone of protection from wiring faults between power converter circuit 12 and distribution circuit 14, illustrated as zone 62. In the case where more than one module (i.e., more than one of Modules A, B and C shown in FIG. 1) is active in distribution circuit 14, the received currents of the active modules are summed and compared to the source current in order to determine the differential current being monitored. Other node pairs between which current may be monitored in order to apply the differential current algorithm may also be employed in other embodiments.

The configuration of the power conversion and distribution system shown in FIG. 1 is scalable, in that multiple circuit blocks may be used at any level of the system, including at the level of generator circuit 10, power converter circuit 12, and/or distribution circuit 14. For example, in a system where the circuit blocks are located remotely from one another, it may be advantageous for multiple generator circuits or power converter circuits to be connected together. The present configuration of current sensors in the circuit blocks provides the ability to monitor differential currents to detect wiring faults between any of the circuit blocks, as well as to detect internal faults across AC/AC converters in power converter circuit blocks.

Differential Power Algorithm

In addition to wiring faults that manifest themselves in the form of higher current loss between circuit blocks, series arc faults are also undesirable and should be detected in some systems. A series arc fault does not result in "lost" current shunted to ground or other conductors, but instead is a condition in which an open circuit, partial open circuit, or high resistivity connection is present in the wiring path of the circuit. A series arc fault therefore is typically not detectable by a differential current algorithm as described above, as nearly all source current is provided to (and through) the arc fault, and is received at the downstream wiring and load.

The presence of series arc faults can result in discomfort to passengers or crew in an aircraft application, due to the creation of smoke and/or flames and/or vaporization of metal structures due to the rapid release of large amounts of energy in a series arc fault. Energy is released by the current passing through the series fault, which has a high voltage differential across the fault and also a large power difference on the output side of the fault compared to the input side of the fault. This can be detected and isolated by calculating and comparing the power at various points of the power conversion and distribution system, and then distinguishing faults from normally occurring losses, voltage level changes, and/or frequency conversion changes in various components of the system. An equation representing an exemplary criteria for detecting a fault according to a differential power algorithm is shown below:

$$\text{Fault:Source Power-Received Power} > (J+T)*\text{Source Power}$$

In this equation, Source Power is equal to Vout*Tout for a DC system, and is equal to the sum of Vout*Tout for each phase of a three-phase system. Received Power is equal to Vin*Iin for a DC system, and is equal to the sum of Vin*Iin for each phase of a three-phase system. J is a constant that represents the power efficiency level of the selected part of the system during normal operation, and T is a constant that is selected to provide a tolerance level to prevent false fault determinations. For example, a selected part of the system (e.g., AC/AC power converter 30 shown in FIG. 1) may have a 10% power loss (i.e., 90% power efficiency) during normal operation. This would result in J being 0.10. It may be desirable in such a system to provide a 5% tolerance that prevents a positive fault detection due to small fluctuations that occur during normal operation, while detecting large power losses that are the result of a series arc fault. This would result in T being selected to be 0.05, to provide this 5% tolerance, so that power losses greater than 15% would be identified as series arc faults. In order to detect a fault, the equation must be satisfied for an amount of time that exceeds a threshold, so that spurious signal variations do not result in false positive detections of faults.

The detection of differential power differences also allows for detection of failure conditions that are characterized by observed intermittency in series arc faults, where the power difference is large for a brief period, and then appears normal. The condition of the fault appearing, and then disappearing, may be sustained for an extended period, with each fault appearance not exceeding the defined delay period for fault confirmation. In some cases, the fault appears for a very brief time, and is absent for a long time and then reappears. To provide correct recognition and segregation of this kind of fault, a calculation of fault appearance and fault energy should be made, asymmetric to the calculation of the absence of the fault, so that an effective memory of the apparent lost energy is used for comparison to the defined threshold. In one exemplary condition, the fault energy accumulation calculation occurs at a rate of four to six times the calculated rate of fault energy decay.

Figure 2:
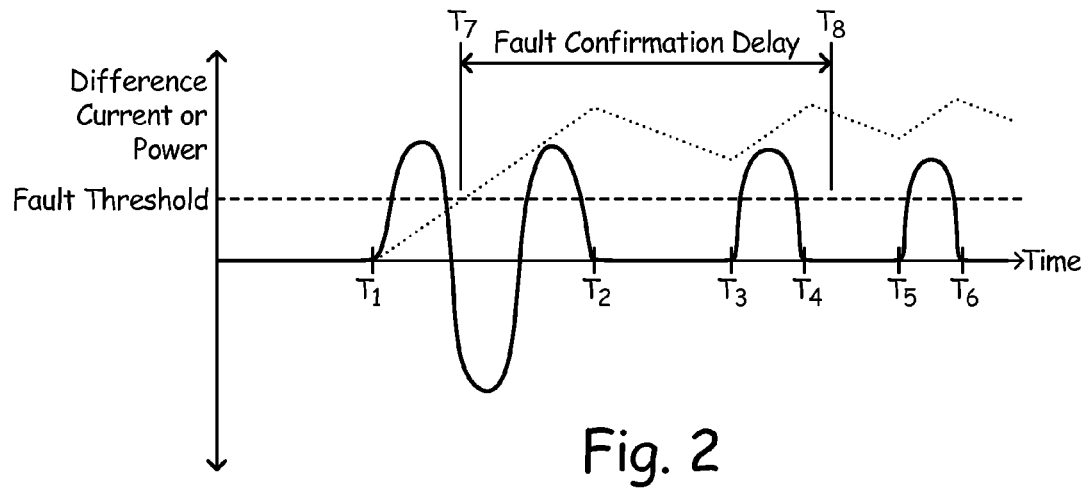
FIG. 2 is a diagram illustrating an example of a fault detection algorithm based on detected differential power (or current, in some embodiments) differences.

FIG. 2 is a diagram illustrating an example of the fault detection algorithm based on detected differential power (or current, in some embodiments) differences described above. In the example shown, a fault begins to occur at time T1, which is indicated by the differential power waveform appearing there. While the differential power waveform is present, a fault calculation counter is incremented at a fast rate, as indicated by the dotted line in FIG. 2. When the fault disappears at time T2, the fault calculation counter is decremented at a slow rate. A fault begins to occur again at time T3 (resulting in the fault calculation counter being incremented at the fast rate), disappears again at time T4 (resulting in the fault calculation counter being decremented at the slow rate), appears again at time T5 (fast rate increment of fault calculation counter), and disappears again at time T6 (slow rate decrement of fault calculation counter). Once the fault calculation counter exceeds a fault threshold (illustrated by the dashed line in FIG. 2), a fault confirmation delay period begins at time T7, and ends at the end of that delay period at time T8. If the fault calculation counter exceeds the fault threshold at the end of the fault confirmation delay period, then a fault is detected. This method allows detection of intermittent series arc faults based on detected power or current differential.

In an exemplary embodiment, the fault energy accumulated is counted as soon as the observed power difference (or current difference, in some embodiments) exceeds a count inhibit threshold, which in one example may be set at a value of one half of the threshold at which a series arc fault is detected. If the observed power difference is above this count inhibit threshold, then an energy loss count is accumulated to be proportional to the product of the power difference multiplied by the time that the difference exceeds the count inhibit threshold. During the time that the power difference is less than the count inhibit threshold, then the accumulated count of energy loss is decremented at a rate that is four to six times slower than the product of the count inhibit threshold times the time.

Figure 3:
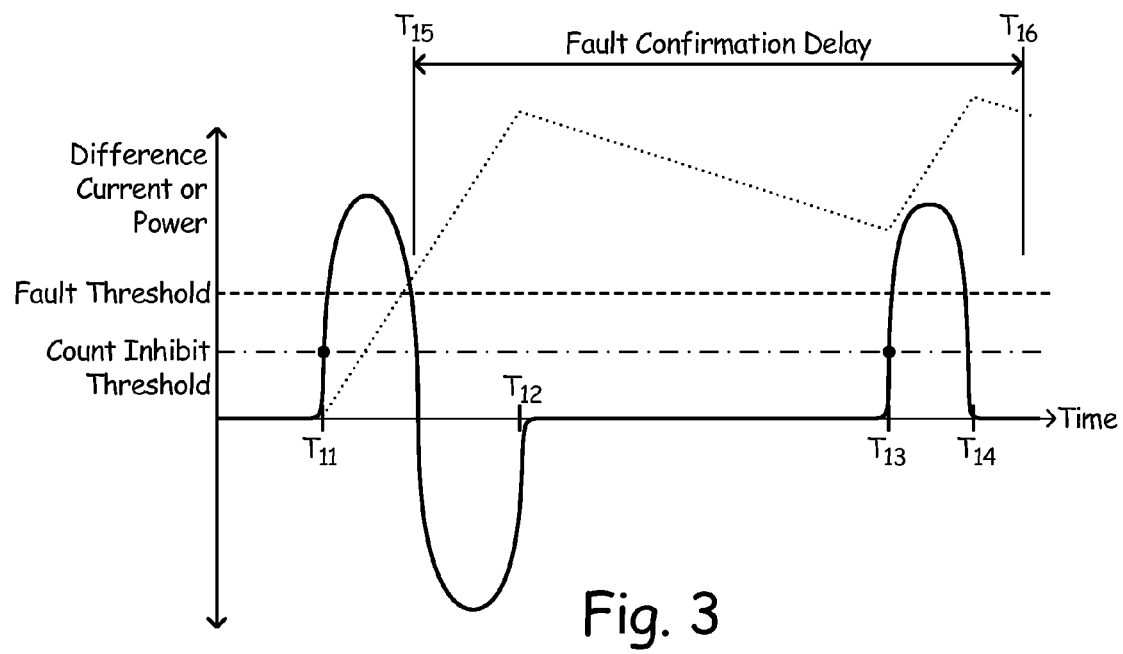
FIG. 3 is a diagram illustrating an example of the fault detection algorithm based on a counting method.

FIG. 3 is a diagram illustrating an example of the fault detection algorithm based on the counting method described above. In the example shown, a fault begins to occur at time T11, which is indicated by the differential power waveform appearing there. When the differential power waveform exceeds a count inhibit threshold (illustrated by the mixed dashed and dotted line in FIG. 3), a fault calculation counter is incremented at a fast rate, as indicated by the dotted line in FIG. 3. When the differential power waveform falls below the count inhibit threshold at time T12, the fault calculation counter is decremented at a slow rate. A fault begins to occur again at time T13 (resulting in the fault calculation counter being incremented at the fast rate when the differential power exceeds the count inhibit threshold), and disappears again at time T14 (resulting in the fault calculation counter being decremented at the slow rate when the differential power falls below the count inhibit threshold). Once the fault calculation counter exceeds a fault threshold (illustrated by the dashed line in FIG. 3), a fault confirmation delay period begins at time T15, and ends at the end of that delay period at time T16. If the fault calculation counter exceeds the fault threshold at the end of the fault confirmation delay period, then a fault is detected. This method allows detection of intermittent series arc faults based on detected power or current differential that exceeds a count inhibit threshold.

As shown in FIG. 1, the differential power algorithm is applied to create a zone of differential power protection between the input terminal and the output terminal of AC/AC power converter 30, illustrated as zone 64. The power difference is monitored by monitoring the voltage at the input terminal of AC/AC power converter 30 and the current through current sensor 32 for the Source Power, and by monitoring the voltage at the output terminal of AC/AC power converter 30 and the current through current sensor 34 for the Received Power. When a series arc fault is detected, by virtue of system controller/processor calculating that the difference between the Source Power and the Received Power exceeds (J+T) times the Source Power (such as 0.15 times the Source Power), AC/AC generator 30 can be disabled by a control signal from system controller/processor 16 to prevent potentially damaging operation of the system. System controller/processor 16 can also disable AC/AC generator 30 if the "heartbeat" health monitor signal from AC/AC generator 30 does not indicate proper, healthy operation.

The differential power algorithm could also be applied to other locations (node pairs) in the power conversion and distribution system. For example, the power difference between AC generator 20 and the input terminal of AC/AC power converter 30 may be monitored, by monitoring the generator voltage and the current through current sensor 22 for the Source Power, and by monitoring the voltage at the input terminal of AC/AC power converter 30 and the current through current sensor 32 for the Received Power. As another example, the power difference between AC generator 20 and the output terminal of AC/AC power converter 30 may be monitored, by monitoring the generator voltage and the current through current sensor 22 for the Source Power, and by monitoring the voltage at the output terminal of AC/AC power converter 30 and the current through current sensor 34 for the Received Power.

The combination of the differential current algorithm and the differential power algorithm provides rapid and redundant protection that allows a high level of system safety to be achieved in operation of the power conversion and distribution system, at a number of locations and protection zones. In addition, an independent hardware protection scheme may also be provided, as shown in FIG. 1 by independent distribution hardware protection modules 54, 44 and 38 in system controller/processor 16, distribution circuit 14, and power converter circuit 12, respectively. This independent hardware protection scheme provides a redundant, hardware-based data path for communication of the calculated difference between the current through current sensor 34 and the current through current sensor 40. Independent distribution hardware protection module 38 in power converter circuit either includes or communicates with a processor that has the ability to disable AC/AC power converter 30 if the calculated current difference exceeds a threshold, as described above in the explanation of the differential current algorithm. This redundant, hardware-based data communication path provides an independent and dissimilar mechanism for protection of the system from potentially damaging faults, to further improve the safety of operating the system.

Load overcurrent may also be monitored as shown in FIG. 1 to provide load overcurrent protection zone 66, in a manner generally known in the art.

Figure 4:
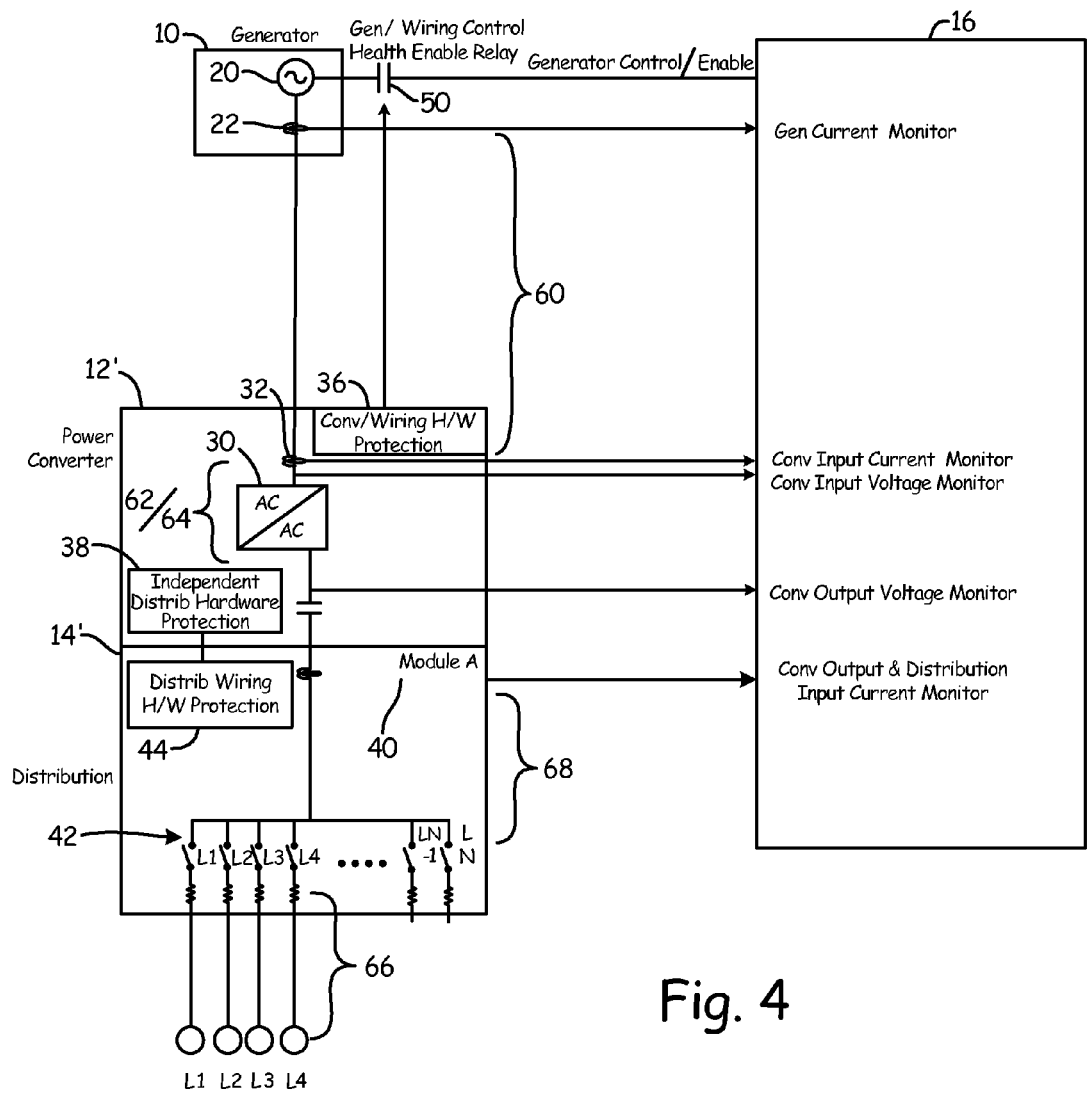
FIG. 4 is a simplified schematic block diagram of a single line of a power conversion and distribution system utilizing a fault protection configuration according to an alternative embodiment of the present invention.

FIG. 4 is a simplified schematic block diagram of a single line of a power conversion and distribution system utilizing a fault protection configuration according to an alternative embodiment of the present invention. The power conversion and distribution system shown in FIG. 4 is similar to that shown in FIG. 1, except that power converter circuit 12' is co-located with Module A of distribution circuit 14'. In this configuration, the differential power protection zone 64 is realized by calculating differential power based on monitoring of the voltage at the input terminal of AC/AC power converter 30 and the current through current sensor 32 for the Source Power, and on monitoring of the voltage at the output terminal of AC/AC power converter 30 and the current through current sensor 40 for the Received Power. Differential current protection zone 62 is applied to the same location (node pair), as illustrated in FIG. 4. Converter/distribution panel protection zone 68 is also realized by calculating differential power and/or current based on monitoring of the voltage at the output of power converter circuit 12' and/or the current at current sensor 40, and by monitoring the power and/or current at the input of the load(s) 42. Other node pairs between which current or power differences may be monitored in order to apply the differential current or power algorithm may also be employed in other embodiments.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A power conversion and distribution system comprising:
   a generator circuit including an electrical power generator configured to generate a power output signal;
   a power converter circuit connected to receive the power signal from the electrical power generator and to provide a converted power output signal;
   a distribution circuit connected to receive the converted power output signal and distribute the converted power output signal to at least one module that includes a load; and
   a system controller coupled to the generator circuit, the power converter circuit and the distribution circuit, and being configured to monitor differential current between at least one first node pair selected from the group consisting of an output of the generator circuit and an input of the power converter circuit, and an output of the power converter circuit and an input of the at least one module of the distribution circuit, to monitor differential power between at least one second node pair selected from the group consisting of the output of the generator circuit and the input of the power converter circuit, the output of the generator circuit and the output of the power converter circuit, the input of the power converter circuit and the output of the power converter circuit, to detect a current loss fault based on the monitored differential current, and to detect a series arc fault based on the monitored differential power.

2. The power conversion and distribution system of claim 1, wherein the generator circuit includes a first current sensor at the output of the generator circuit, the power converter circuit includes a second current sensor at the input of the power converter circuit and a third current sensor at an output of the power converter circuit, and the at least one module of the distribution circuit includes a fourth current sensor at the input of the at least one module of the distribution circuit.

3. The power conversion and distribution system of claim 1, wherein the system controller monitors a health signal from the power converter circuit and disables the power converter circuit if the health signal is not received.

4. The power conversion and distribution system of claim 1, wherein the system controller monitors differential current to determine a current loss fault according to the following equation:

$$\text{Fault:Source Current} - \text{Received Current} > [1+k] * \text{Normal Current Loss}$$

where Source Current and Received Current are monitored current values at a source node and a receiving node of each first node pair, Normal Current Loss is a predetermined value based on measured or calculated performance of the power conversion and distribution system, and k is a selected constant.

5. The power conversion and distribution system of claim 1, wherein the system controller monitors differential power to determine a series arc fault according to the following equation:

$$\text{Fault:Source Power} - \text{Received Power} > (J+T) * \text{Source Power}$$

where Source Power and Received Power are equal to a monitored voltage value multiplied by a monitored current value at a source node and a receiving node of each second node pair, J is a predetermined value based on measured or calculated power efficiency of the power conversion and distribution system at the node pair during normal operation, and T is a selected constant.

6. The power conversion and distribution system of claim 1, wherein the system controller is configured to monitor differential power to determine a series arc fault by:
   incrementing a fault calculation counter at a first rate upon detecting a power difference between the at least one second node pair;
   decrementing the fault calculation counter at a second rate slower than the first rate when the power difference between the at least one second node pair is no longer detected;
   comparing the fault calculation counter to a fault threshold value after a fault confirmation delay time following detection of the power difference between the at least one second node pair; and
   determining the series arc fault based on the fault calculation counter exceeding the fault threshold value in the comparing step.

7. The power conversion and distribution system of claim 1, wherein the system controller is configured to monitor differential power to determine a series arc fault by:
   incrementing a fault calculation counter at a first rate upon detecting a power difference between the at least one second node pair that exceeds a count inhibit threshold;
   decrementing the fault calculation counter at a second rate slower than the first rate when the power difference between the at least one second node pair falls below the count inhibit threshold;
   comparing the fault calculation counter to a fault threshold value after a fault confirmation delay time following detection of the power difference between the at least one second node pair exceeding the count inhibit threshold; and determining the series arc fault based on the fault calculation counter exceeding the fault threshold value in the comparing step.

8. The power conversion and distribution system of claim 1, further comprising independent hardware protection circuits in the system controller, the distribution circuit and the power converter circuit connected to provide a separate path for communication of data relating to fault determinations to the power converter circuit.

9. A method of detecting faults in a power conversion and distribution system that includes a generator circuit including an electrical power generator configured to generate an power output signal, a power converter circuit connected to receive the power output signal from the electrical power generator and to provide a converted power output signal, and a distribution circuit connected to receive the converted power output signal and distribute the converter power output signal to at least one module that includes a load, the method comprising:

monitoring differential current between at least one first node pair selected from the group consisting of an output of the generator circuit and an input of the power converter circuit, and an output of the power converter circuit and an input of the at least one module of the distribution circuit;

determining a current loss fault according to the following equation

[Fault:Source Current−Received Current>[1+$k$]*Normal Current Loss]

where Source Current and Received Current are monitored current values at a source node and a receiving node of each first node pair, Normal Current Loss is a predetermined value based on measured or calculated performance of the power conversion and distribution system, and k is a selected constant;

monitoring differential power between at least one second node pair selected from the group consisting of the output of the generator circuit and the input of the power converter circuit, the output of the generator circuit and the output of the power converter circuit, and the input of the power converter circuit and the output of the power converter circuit; and determining a series arc fault according to the following equation

[Fault:Source Power−Received Power>($J+T$)*Source Power]

where Source Power and Received Power are equal to a monitored voltage value multiplied by a monitored current value at a source node and a receiving node of each second node pair, J is a predetermined value based on measured or calculated power efficiency of the power conversion and distribution system at the node pair during normal operation, and T is a selected constant.

10. The method of claim 9, wherein k is selected to be 0.08.

11. The method of claim 9, wherein T is selected to be 0.05.

12. The method of claim 9, further comprising monitoring a health signal from the power converter circuit and disabling the power converter circuit if the health signal is not received.

13. The method of claim 9, wherein monitoring differential current between the at least one first node pair comprises measuring current with current sensors in at least two of the following locations: the output of the generator circuit, the input of the power converter circuit, an output of the power converter circuit, and the input of the at least one module of the distribution circuit.

14. The method of claim 9, wherein determining the current loss fault and determining the series arc fault is performed in a system controller coupled to the generator circuit, the power converter circuit and the distribution circuit, and wherein the power converter circuit is disabled in response to determining the current loss fault or the series arc fault.

15. The method of claim 14, further comprising:
redundantly communicating a signal to disable the power converter circuit via independent hardware circuits in the system controller, the distribution circuit and the power converter circuit.

* * * * *

UNITED STATES PATENT AND TRADEMARK OFFICE
CERTIFICATE OF CORRECTION

Page 1 of 1

PATENT NO.        : 9,188,620 B1
APPLICATION NO.   : 14/293756
DATED             : November 17, 2015
INVENTOR(S)       : Carl A. Wagner It is certified that error appears in the above-identified patent and that said Letters Patent is hereby corrected as shown below:

In the specification,

Col. 4, Line 39
  Delete "Vout*Tout"
  Insert -- Vout*Iout --

Col. 4, Line 40
  Delete "Vout*Tout"
  Insert -- Vout*Iout --

Signed and Sealed this
Seventh Day of June, 2016

Michelle K. Lee
*Director of the United States Patent and Trademark Office*